United States Patent
Harada et al.

(10) Patent No.: US 9,574,269 B2
(45) Date of Patent: Feb. 21, 2017

(54) METHOD AND APPARATUS FOR FORMING THIN FILM

(71) Applicant: TOKYO ELECTRON LIMITED, Tokyo (JP)

(72) Inventors: Katsushige Harada, Nirasaki (JP); Susumu Takada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/666,635

(22) Filed: Mar. 24, 2015

(65) Prior Publication Data

US 2016/0281224 A1 Sep. 29, 2016

(30) Foreign Application Priority Data

Mar. 27, 2014 (JP) ................................. 2014-065142

(51) Int. Cl.
*C23C 16/455* (2006.01)
*C23C 16/46* (2006.01)
*C23C 16/52* (2006.01)

(52) U.S. Cl.
CPC ............. *C23C 16/455* (2013.01); *C23C 16/46* (2013.01); *C23C 16/463* (2013.01); *C23C 16/52* (2013.01)

(58) Field of Classification Search
None
See application file for complete search history.

(56) References Cited

U.S. PATENT DOCUMENTS

| 6,124,158 A * | 9/2000 | Dautartas .......... H01L 21/02178 257/E21.209 |
| 2002/0013041 A1* | 1/2002 | Yoo ....................... C23C 16/405 438/586 |
| 2015/0315704 A1* | 11/2015 | Nakano ............. C23C 16/45538 427/569 |

FOREIGN PATENT DOCUMENTS

| JP | 2001-098376 A | 4/2001 |
| JP | 2007-005633 A | 1/2007 |
| JP | 2008-135633 A | 6/2008 |
| JP | 2009-246365 A | 10/2009 |
| JP | 2010-287925 A | 12/2010 |
| JP | 2012-134311 A | 7/2012 |
| JP | 2014-187393 A | 10/2014 |

* cited by examiner

*Primary Examiner* — Joseph Miller, Jr.
(74) *Attorney, Agent, or Firm* — Nath, Goldberg & Meyer; Jerald L. Meyer

(57) ABSTRACT

A method and apparatus of forming a thin film using an organic metal compound gas and oxidizing agents are disclosed. The method includes performing a first film formation process of forming a thin film on an object to be processed using an organic metal compound gas and a first oxidizing agent; performing an annealing process of supplying a second oxidizing agent having stronger oxidizing power than the first oxidizing agent into the reaction chamber while an interior of the reaction chamber is heated to a predetermined temperature; and performing a second film formation process of forming a thin film on the thin film formed in the first thin film formation process using the organic metal compound gas and the second oxidizing agent.

2 Claims, 3 Drawing Sheets

METHOD AND APPARATUS FOR FORMING THIN FILM

CROSS-REFERENCE TO RELATED APPLICATION

This application claims the benefit of Japanese Patent Application No. 2014-065142, filed on Mar. 27, 2014, in the Japan Patent Office, the disclosure of which is incorporated herein in its entirety by reference.

TECHNICAL FIELD

The present disclosure relates to a method and apparatus for forming a thin film.

BACKGROUND

As a method for forming a high-k film (a metal oxide film) such as an AlO layer, a HfO layer, and a ZrO layer, there is proposed atomic layer deposition (ALD) capable of forming an excellent high-k film on an object to be processed, for example, a semiconductor wafer, at a low temperature.

In ALD for forming a high-k film, an organic metal compound gas and an oxidizing agent are alternately supplied, and $H_2O$ is used as the oxidizing agent in order to suppress oxidation of an underlying layer. Further, there is ozone (O3) as an oxidizing agent effective for removing organic and inorganic materials in ALD. Thus, in order to form a high quality high-k film having less impurities within the film while suppressing interface oxidation, a stack film prepared by forming a high-k film using $H_2O$ as an oxidizing agent for an initial layer, and forming a high-k film using $O_3$ as an oxidizing agent for a main layer has been employed.

However, when the high-k film is formed using $O_3$ immediately after forming the high-k film using $H_2O$, there is a problem in that a high quality high-k film cannot be obtained due to reduction in thickness of the high-k film or deterioration in thickness uniformity thereof.

SUMMARY

Some embodiments of the present disclosure provide a method and apparatus for forming a good thin film.

According to one embodiment of the present disclosure, there is provided a method of forming a thin film, the method including: performing a first film formation process of, while an interior of a reaction chamber accommodating an object to be processed is heated to a predetermined temperature, alternately supplying a plurality of times an organic metal compound gas into the reaction chamber to adsorb the organic metal compound onto the object to be processed, and a first oxidizing agent into the reaction chamber heated to the predetermined temperature to oxidizing the organic metal compound adsorbed onto the object to be processed, thereby forming a thin film; after the first film formation process is ended, performing an annealing process of, while the interior of the reaction chamber is heated to the predetermined temperature, supplying a second oxidizing agent having stronger oxidizing power than the first oxidizing agent into the reaction chamber; and after the annealing process is ended, performing a second film formation process of, while the interior of the reaction chamber is heated to the predetermined temperature, alternately supplying a plurality of times the organic metal compound gas into the reaction chamber to adsorb the organic metal compound onto the thin film formed in the first film formation process, and the second oxidizing agent into the reaction chamber heated to the predetermined temperature to oxidize the organic metal compound adsorbed onto the thin film formed in the first film formation process, thereby forming a thin film.

According to another embodiment of the present disclosure, there is provided an apparatus for forming a thin film, including: a heater configured to heat a reaction chamber accommodating an object to be processed to a predetermined temperature, an organic metal compound gas supply unit configured to supply an organic metal compound into the reaction chamber, an oxidizing agent supply unit configured to supply a first oxidizing agent and a second oxidizing agent into the reaction chamber, and a controller configured to control each component of the apparatus. The controller is configured to: control a process of, while an interior of the reaction chamber is heated to the predetermined temperature by controlling the heater, controlling the organic metal compound gas supply unit to supply an organic metal compound gas into the reaction chamber to adsorb the organic metal compound onto the object to be processed, and controlling the oxidizing agent supply unit to supply the first oxidizing agent into the reaction chamber to oxidize the organic metal compound adsorbed onto the object to be processed, thereby forming a thin film; control a process of, while the interior of the reaction chamber is heated to the predetermined temperature by controlling the heater, controlling the heater to heat the reaction chamber to the predetermined temperature, and controlling the oxidizing agent supply unit to supply the second oxidizing agent into the reaction chamber; and control a process of alternately controlling the heater to heat the reaction chamber to the predetermined temperature, controlling the organic metal compound gas supply unit to supply an organic metal compound into the reaction chamber to adsorb the organic metal compound onto the formed thin film, and controlling the oxidizing agent supply unit to supply the second oxidizing agent into the reaction chamber to oxidize the organic metal compound adsorbed onto the thin film, thereby forming a thin film.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
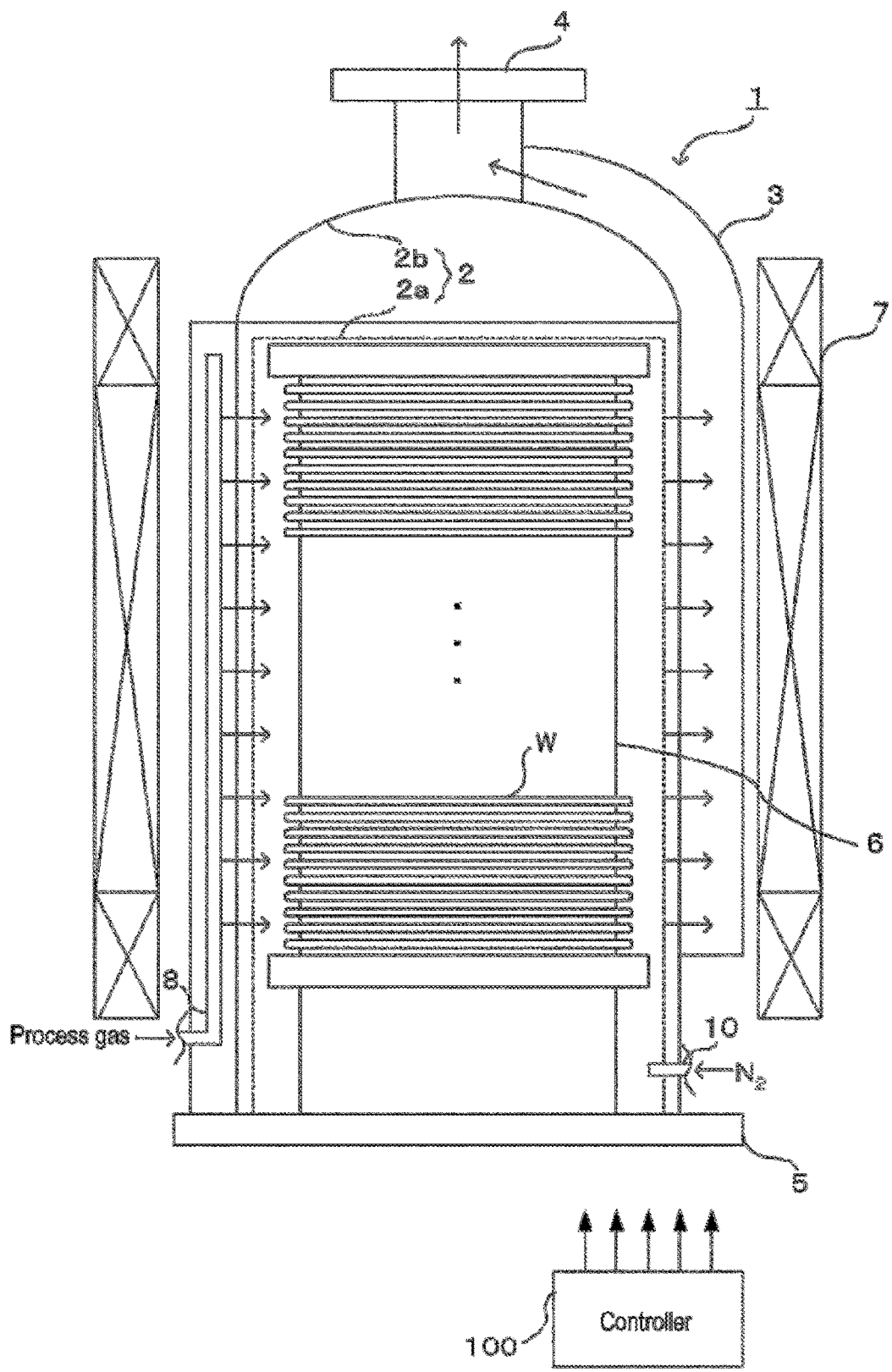
FIG. 1 is a view showing a process apparatus according to one embodiment of the present disclosure.

In the present embodiments, a description will be given by way of an example in which a batch-type vertical process apparatus, illustrated in FIG. 1 is used as a film formation apparatus.

As illustrated in FIG. 1, the process apparatus 1 includes a reaction tube 2 whose longitudinal direction is along a vertical direction. The reaction tube 2 has a double-tube structure which includes an inner tube 2a, and a roofed outer tube 2b configured to cover the inner tube 2a with being spaced at a predetermined distance from the inner tube 2a. Sidewalls of the inner tube 2a and the outer tube 2b have a plurality of openings as indicated by arrows in FIG. 1. The inner tube 2a and the outer tube 2b are made of quartz having excellent heat resistance and corrosion resistance.

An exhaust unit 3 is provided at one side of the reaction tube 2 to exhaust gas from the reaction tube 2. The exhaust unit 3 extends upward along the reaction tube 2 and communicates with the reaction tube 2 through the openings formed in the sidewall of the reaction tube 2. An upper end of the exhaust unit 3 is connected to an exhaust port 4 arranged at an upper portion of the reaction tube 2. An exhaust pipe (not shown) is connected to the exhaust port 4. Pressure regulating mechanisms such as a valve (not shown) and a vacuum pump 127 described below are installed on the exhaust pipe. By virtue of the pressure regulating mechanisms, a gas supplied from one side of the sidewall of the outer tube 2b (a process gas supply pipe 8) is exhausted to the exhaust pipe through the inner tube 2a, the other side of the sidewall of the outer tube 2b, the exhaust unit 3, and the exhaust port 4. Thus, the interior of the reaction tube 2 is controlled to a desired pressure (vacuum degree).

A cover 5 is disposed at a lower side of the reaction tube 2. The cover 5 is made of a material having excellent heat resistance and corrosion resistance, for example, quartz. The cover 5 is configured to be moved up and down by a boat elevator 128 described later. When the cover 5 is moved up by the boat elevator 128, a lower side (furnace opening portion) of the reaction tube 2 is closed. When the cover 5 is moved down by the boat elevator 128, the lower side (furnace opening portion) of the reaction tube 2 is opened.

A wafer boat 6 is mounted on the cover 5. The wafer boat 6 is made of, for example, quartz. The wafer boat 6 is configured to accommodate a plurality of sheets of the semiconductor wafers W at predetermined intervals in a vertical direction. Furthermore, a heat insulating container configured to prevent an internal temperature of the reaction tube 2 from being decreased due to heat dissipation from the furnace opening portion of the reaction tube 2, or a rotary table configured to rotatably load the wafer boat 6 may be disposed on an upper portion of the cover 5. The wafer boat 6 may be mounted on the heat insulating container or the rotary table. In this case, it is easy to uniformly control the temperature of the semiconductor wafers W accommodated within the wafer boat 6.

A heater 7 for temperature elevation configured as, for example, a resistive heating element, is installed around the reaction tube 2 to surround the reaction tube 2. The interior of the reaction tube 2 is heated to a predetermined temperature by the heater 7. As a result, the semiconductor wafers W accommodated within the reaction tube 2 are heated to a predetermined temperature.

The process gas supply pipe 8 configured to supply a process gas into the reaction tube 2 (the outer tube 2b) is inserted into the reaction tube 2 through a side surface near the lower end of the reaction tube 2. A plurality of supply holes is formed in the process gas supply pipe 8 at predetermined intervals in a vertical direction. The process gas is supplied into the reaction tube 2 (the outer tube 2b) through the supply holes. Thus, as indicated by arrows in FIG. 1, the process gas is supplied into the reaction tube 2 from a plurality of parts in a vertical direction.

The process gas includes a film forming gas for forming a thin film (high-k film) on a semiconductor wafer W. The film forming gas may include an organic metal compound gas and an oxidizing agent. Examples of the organic metal compound gas may include trimethyl aluminum (TMA), tetrakis(dimethylamino)hafnium (TDMAH), tetrakis(ethylmethylamino)hafnium (TEMAH), tetrakis(ethylmethylamino)zirconium (TEMAZ), tetrakis(dimethylamino)titanium (TDMAT), and the like. Examples of the oxidizing agent may include $H_2O$, ozone ($O_3$), and the like.

A nitrogen gas supply pipe 10 for supplying nitrogen ($N_2$) as a diluting gas and a purge gas into the reaction tube 2 (the outer tube 2b) is inserted into the side surface near the lower end of the reaction tube 2.

The process gas supply pipe 8 and the nitrogen gas supply pipe 10 are connected to gas supply sources (not shown) through mass flow controllers (MFCs) 125 described below.

A plurality of temperature sensors 122, for example, thermocouples, for measuring the internal temperature of the reaction tube 2 and a plurality of pressure gauges 123 for measuring the internal pressure of the reaction tube 2 are disposed within the reaction tube 2.

Figure 2:
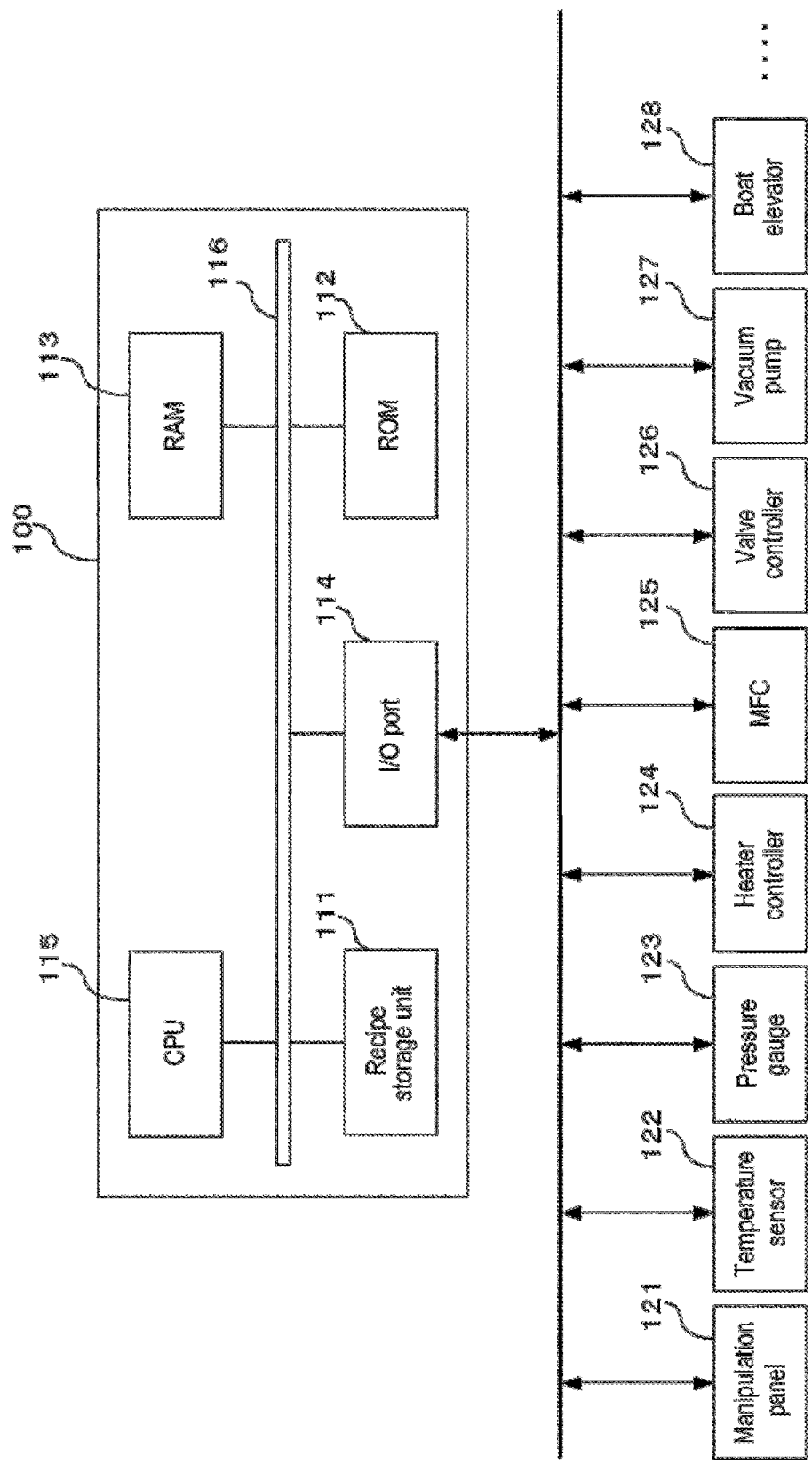
FIG. 2 is a block diagram showing a configuration of a controller employed in the apparatus shown in FIG. 1.

The process apparatus 1 further includes a controller 100 configured to control the respective components of the apparatus. FIG. 2 shows the configuration of the controller 100. As shown in FIG. 2, a manipulation panel 121, the temperature sensors 122, the pressure gauges 123, a heater controller 124, the MFCs 125, valve controllers 126, the vacuum pump 127, the boat elevator 128 and the like are connected to the controller 100.

The manipulation panel 121 is provided with a display screen and manipulation buttons. The manipulation panel 121 transmits operator instructions to the controller 100 and displays a variety of information received from the controller 100 on the display screen.

The temperature sensors 122 are configured to measure the temperatures of the respective components within the reaction tube 2 and the exhaust pipe, and to notify the controller 100 of the measured values.

The pressure gauges 123 are configured to measure the pressures of the respective components within the reaction tube 2 and within the exhaust pipe, and to notify the controller 100 of the measured values.

The heater controller 124 individually controls the heater 7. In response to instructions received from the controller 100, the heater controller 124 is configured to supply electric current to the heater 7 for heating thereof. Moreover, the heater controller 124 is configured to individually measure power consumption of the heater 7 and notifies the controller 100 of the measured values.

The MFCs 125 are disposed at the respective pipes, such as the process gas supply pipe 8, the nitrogen gas supply pipe 10 and the like, to control flow rates of gases flowing through the respective pipes into an amount instructed by the controller 100. In addition, the MFCs 125 are configured to measure the actual flow rates of the gases and to notify the controller 100 of the measured flow rates.

The valve controllers 126 are configured to control the opening degrees of the valves disposed at the respective pipes at the values instructed by the controller 100.

The vacuum pump 127 is connected to the exhaust pipe and configured to exhaust the gas within the reaction tube 2.

The boat elevator 128 moves the cover 5 upward to load the wafer boat 6 (the semiconductor wafers W) into the reaction tube 2, and moves the cover 5 downward to unload the wafer boat 6 (the semiconductor wafers W) from the interior of the reaction tube 2.

The controller 100 includes a recipe storage unit 111, a read only memory (ROM) 112, a random access memory (RAM) 113, an input/output (I/O) port 114, a central processing unit (CPU) 115, and a bus 116 interconnecting these components to one another.

A setup recipe and a plurality of process recipes are stored in the recipe storage unit 111. The setup recipe is only stored in the recipe storage unit 111 at an initial stage of manufacturing the process apparatus 1. The setup recipe is executed to generate thermal models and the like according to respective process apparatuses. The process recipes are prepared for each heat treatment (process) actually performed by a user. Each of the process recipes defines temperature changes of the respective components, pressure changes within the reaction tube 2, and timings for starting and stopping supply of various types of gases and a supply amount of various types of gases and the like from the time of loading the semiconductor wafers W into the reaction tube 2 to the time of unloading the processed semiconductor wafers W from the reaction tube 2.

The ROM 112 is constituted by an electrically erasable programmable read only memory (EEPROM), a flash memory, a hard disk or the like. The ROM 112 is a recording medium that stores an operation program of the CPU 115.

The RAM 113 serves as a work area of the CPU 115.

The I/O port 114 is connected to the manipulation panel 121, the temperature sensors 122, the pressure gauges 123, the heater controller 124, the MFCs 125, the valve controllers 126, the vacuum pump 127, the boat elevator 128, and the like. The I/O port 114 is configured to control input and output of data and signals.

The CPU 115 constitutes a core of the controller 100 and executes operation programs stored in the ROM 112. In response to instructions received through the manipulation panel 121, the CPU 115 controls operations of the process apparatus 1 according to the recipes (process recipes) stored in the recipe storage unit 111. That is, the CPU 115 controls the temperature sensors 122, the pressure gauges 123 and the MFCs 125 to measure the temperatures, pressures, and flow rates of the respective components within the reaction tube 2 and the exhaust pipe. Based on the measurement data, the CPU 115 outputs control signals to the heater controller 124, the MFCs 125, the valve controllers 126, the vacuum pump 127 and the like, thereby controlling the respective components in accordance with the process recipes.

The bus 116 delivers information between the respective components.

Next, a method of forming a thin film using the process apparatus 1 configured as described above will be described. In the following description, operations of the respective components constituting the process apparatus 1 are controlled by the controller 100 (CPU 115). In addition, the controller 100 (CPU 115) controls the heater controller 124 (heater 7), the MFCs 125, the valve controllers 126, and the like in the aforementioned manner, such that the temperature, pressure and flow rates of gases in the reaction tube 2 in the respective processes are set to conditions conforming to, for example, the recipe (time sequence) as shown in FIG. 3.

Figure 3:
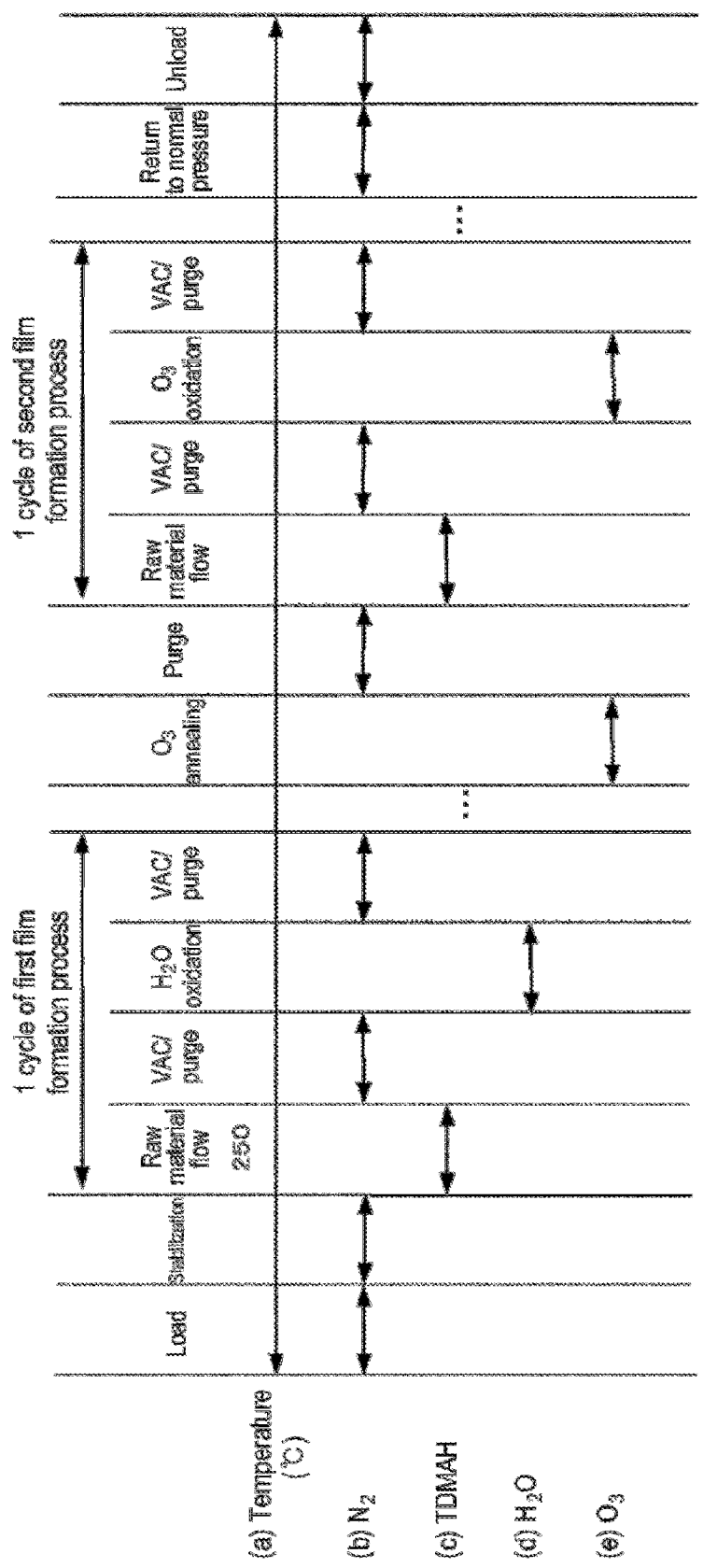
FIG. 3 is a diagram explaining a method of forming a thin film according to one embodiment of the present disclosure.

FIG. 3 is a diagram explaining a method of forming a thin film according to one embodiment of the present disclosure. As shown in FIG. 3, the film formation method includes a first film formation process, an ozone ($O_3$) annealing process, and a second film formation process in which a thin film is formed using an oxidizing agent having stronger oxidizing power than that used in the first film formation process. In this embodiment, by way of example, it will be described that a HfO film is formed using tetrakis(dimethylamino)hafnium (TDMAH) as a film forming gas and $H_2O$ or $O_3$ as an oxidizing agent.

First, an inner temperature of the reaction tube 2 is set to a predetermined temperature, for example, 250 degrees C., as shown at (a) in FIG. 3. Further, a predetermined amount of nitrogen is supplied from the nitrogen gas supply pipe 10 into the reaction tube 2, as shown at (b) in FIG. 3. Then, the wafer boat 6 in which semiconductor wafers W are accommodated is loaded on the cover 5. Then, the cover 5 is moved up by the boat elevator 128 to load the semiconductor wafers W (wafer boat 6) within the reaction tube 2 (loading process).

Next, the interior of the reaction tube 2 is set to a predetermined temperature, for example, 250 degrees C., as shown at (a) in FIG. 3 while a predetermined amount of nitrogen is supplied from the nitrogen gas supply pipe 10 into the reaction tube 2, as shown at (b) in FIG. 3. Then, the interior of the reaction tube 2 is stabilized at this temperature and pressure (stabilization process).

Here, the inner temperature of the reaction tube 2 may be set, for example, in a range of 150 degrees C. to 400 degrees C., or 200 degrees C. to 300 degrees C. Within this range of the inner temperature of the reaction tube 2, it is possible to enhance film quality and thickness uniformity of a thin film to be formed.

When the interior of the reaction tube 2 is stabilized at a predetermined temperature, the first film formation process is performed. First, supply of nitrogen from the nitrogen gas supply pipe 10 is stopped and a film forming gas is supplied into the reaction tube 2. Specifically, a predetermined amount of tetrakis(dimethylamino)hafnium (TDMAH) is supplied from the process gas supply pipe 8 (raw material flow step), as shown at (c) in FIG. 3.

The TDMAH supplied into the reaction tube 2 is heated and activated within the reaction tube 2. Accordingly, when the TDMAH is supplied into the reaction tube 2, the semiconductor wafer W reacts with activated Hf such that a predetermined amount of Hf is adsorbed onto the semiconductor wafer W.

After a predetermined amount of Hf is adsorbed onto the semiconductor wafer W, the supply of the TDMAH from the process gas supply pipe 8 is stopped. Then, the gas within the reaction tube 2 is exhausted, and a predetermined amount of nitrogen is supplied from the nitrogen gas supply pipe 10 into the reaction tube 2 to exhaust the gas from the reaction tube 2 (vacuum/purge step), as shown at (b) in FIG. 3.

Then, the supply of nitrogen from the nitrogen gas supply pipe 10 is stopped and an oxidizing agent is supplied into the reaction tube 2. Specifically, a predetermined amount of $H_2O$ is supplied from the process gas supply pipe 8 ($H_2O$ oxidation step), as shown at (d) in FIG. 3.

$H_2O$ supplied into the reaction tube 2 is heated and activated within the reaction tube 2. Accordingly, when $H_2O$ is supplied into the reaction tube 2, Hf adsorbed onto the semiconductor wafer W is oxidized to thereby form a predetermined amount of HfO film on the semiconductor wafer W.

When the HfO film is formed at a predetermined amount on the semiconductor wafer W, the supply of H$_2$O from the process gas supply pipe 8 is stopped. Then, the gas within the reaction tube 2 is exhausted and a predetermined amount of nitrogen is supplied from the nitrogen gas supply pipe 10 into the reaction tube 2 to exhaust the gas from the reaction tube 2 (vacuum/purge step), as shown at (b) in FIG. 3.

In this way, one cycle of the first film formation process is completed. Then, the cycle is started again from the raw material flow step. In addition, the cycle is repeated a predetermined number of times to form an HfO film having a desired thickness on the semiconductor wafer W, and then the first film formation process is ended.

When the first film formation process is ended, the inner temperature of the reaction tube 2 is set to a predetermined temperature, for example, 250 degrees C., as shown at (a) in FIG. 3, and a predetermined amount of ozone (O$_3$) is supplied from the process gas supply pipe 8 into the reaction tube 2 to anneal the interior of the reaction tube 2, (O$_3$ annealing process), as shown at (e) in FIG. 3.

When the ozone is supplied into the reaction tube 2, the ozone oxidizes the HfO film formed by the first film formation process to thereby reform the HfO film. Thus, ozone supplied into reaction tube 2 in the second film formation process to be followed is supplied to Hf adsorbed onto the semiconductor wafer in the second film formation process, so that an HfO film can be formed in the second film formation process.

A conventional film formation process has difficulty in forming a high-k film having good quality due to reduction in thickness of the high-k film or deterioration in thickness uniformity thereof. That is, since the HfO film (high-k film) formed using H$_2$O in the first film formation process is insufficiently oxidized, O$_3$ supplied into the reaction tube 2 in the second film formation process is used for reforming the HfO film formed in the first film formation process. Therefore, it is believed that the problem of the conventional film formation process is caused by insufficient supply of O$_3$ to the semiconductor wafer in the second film formation process. In the embodiment of the present disclosure, since the O$_3$ annealing process is performed after the first film formation process, ozone supplied into the reaction tube 2 in the following process, i.e., the second film formation process, is supplied to Hf adsorbed onto the semiconductor wafer in the second film formation process, so that the HfO film can be formed in the second film formation process. As a result, it is possible to form a HfO film (high-k film) having good quality without reduction in film thickness or deterioration in thickness uniformity.

When an amount of ozone is sufficiently supplied into the reaction tube 2, the supply of ozone from the process gas supply pipe 8 is stopped. Then, a predetermined amount of nitrogen is supplied from the nitrogen gas supply pipe 10 into the reaction tube 2 to exhaust the gas from the reaction tube 2 (purge process), as shown at (b) in FIG. 3. Further, the inner temperature of the reaction tube 2 is set to a predetermined temperature, for example, 250 degrees C., as shown at (a) in FIG. 3.

When the inner temperature of the reaction tube 2 is set to a predetermined temperature, the second film formation process is performed. In the second film formation process, a thin film is formed using an oxidizing agent (O$_3$) having stronger oxidizing power than the oxidizing agent (H$_2$O) used in the first film formation process. This is because the first film formation process is performed by supplying an oxidizing agent having weaker oxidizing power than that used in the second film formation process in order to suppress oxidation of an underlying layer (a surface of the semiconductor wafer W).

First, the supply of nitrogen from the nitrogen gas supply pipe 10 is stopped and a film forming gas is supplied into the reaction tube 2. Specifically, a predetermined amount of tetrakis(dimethylamino)hafnium (TDMAH) is supplied from the process gas supply pipe 8 (raw material flow step), as shown at (c) in FIG. 3.

TDMAH supplied into the reaction tube 2 is heated and activated within the reaction tube 2. Accordingly, when TDMAH is supplied into the reaction tube 2, a predetermined amount of Hf is adsorbed onto the HfO film formed on the semiconductor wafer W.

When a predetermined amount of Hf is adsorbed, the supply of TDMAH from the process gas supply pipe 8 is stopped. Then, the gas within the reaction tube 2 is exhausted, and a predetermined amount of nitrogen is supplied from the nitrogen gas supply pipe 10 into the reaction tube 2 to exhaust the gas from the reaction tube 2 (vacuum/purge step), as shown at (b) in FIG. 3.

Then, the supply of nitrogen from the nitrogen gas supply pipe 10 is stopped and an oxidizing agent is supplied into the reaction tube 2. Specifically, a predetermined amount of O$_3$ having stronger oxidizing power than H$_2$O used in the first film formation process is supplied from the process gas supply pipe 8 (O$_3$ oxidation step), as shown at (d) in FIG. 3.

Ozone (O$_3$) supplied into the reaction tube 2 is heated and activated within the reaction tube 2. Accordingly, when O$_3$ is supplied into the reaction tube 2, a predetermined amount of a HfO film is formed through oxidation of Hf adsorbed onto the HfO film.

Here, since the O$_3$ annealing process is performed before the second film formation process, ozone supplied into the reaction tube 2 in the second film formation process is supplied to Hf, which is adsorbed onto the HfO film in the second film formation process. Thus, the problem that cannot form a high-k film having good quality due to reduction in thickness of the high-k film or deterioration in thickness uniformity may not occur. Accordingly, it is possible to form a high-k film having good quality without reduction in thickness of the high-k film or deterioration in thickness uniformity thereof.

After a predetermined amount of the HfO film is formed, the supply of O$_3$ from the process gas supply pipe 8 is stopped. Then, the gas within the reaction tube 2 is exhausted, and a predetermined amount of nitrogen is supplied from the nitrogen gas supply pipe 10 into the reaction tube 2 to exhaust the gas from the reaction tube 2 (vacuum/purge step), as shown at (b) in FIG. 3.

In this way, one cycle of the second film formation process is completed. Then, the cycle is started again from the raw material flow step. In addition, the cycle is repeated a predetermined number of times to form a HfO film having a desired thickness on the semiconductor wafer W, and then the second film formation process is ended.

When the second film formation process is ended, a predetermined amount of nitrogen is supplied from the nitrogen gas supply pipe 10 into the reaction tube 2, as shown at (b) in FIG. 3, and the inner temperature of the reaction tube 2 is set to a predetermined temperature, for example, 250 degrees C., by the heater 7, as shown at (a) in FIG. 3. Further, a predetermined amount of nitrogen is supplied from the nitrogen gas supply pipe 10 into the reaction tube 2 such that the interior of the reaction tube 2 is returned to normal pressure through purging with nitrogen (normal pressure returning process). Then, the cover 5 is moved down by the boat elevator 128 to unload the semiconductor wafer W (unloading process).

Then, in order to confirm effects of the present disclosure, film thickness and in-plane uniformity were measured on HfO films formed by performing the $O_3$ annealing process and without performing the O3 annealing process under the same conditions as those of the aforementioned embodiment. As a result, it could be confirmed that a HfO film formed without performing the $O_3$ annealing process exhibited deterioration in film thickness and in-plane uniformity, whereas a HfO film formed by performing the $O_3$ annealing process exhibited improvement in film thickness and in-plane uniformity. Furthermore, analysis results of the elemental composition of each of the HfO films obtained through X-ray photoelectron spectroscopy (XPS) showed that impurities contained in the HfO film are reduced by performing the $O_3$ annealing process.

As described above, according to the embodiment of the present disclosure, the $O_3$ annealing process is performed between the first film formation process and the second film formation process, so that a problem that cannot form a high-k film having good film quality due to reduction in film thickness or deterioration in thickness uniformity of the high-k film does not occur. Accordingly, it is possible to form a high-k film having good quality without reduction in thickness of the high-k film or deterioration in thickness uniformity thereof.

Furthermore, it should be understood that the present disclosure is not limited to the above embodiment and various modifications and alterations can be made. Hereinafter, other embodiments of the present disclosure will be described.

In the aforementioned embodiments, the present disclosure has been described by way of an example of forming the HfO film. As an alternative example, the present disclosure may also be applied to any kind of high-k film, such as an ALO film and a ZrO film, which are formed by alternately supplying an organic metal compound gas and an oxidizing agent.

In the aforementioned embodiments, the present disclosure has been described by way of an example of using $H_2O$ and $O_3$ as oxidizing agents. However, the present disclosure is not limited thereto and any kind of oxidizing agent may be used so long as two selected oxidizing agents have different oxidizing power.

In supplying the process gas, the process gas may be supplied alone or may be supplied as a mixture gas of the process gas and nitrogen as a diluting gas. The mixture gas facilitates setting of a process time and the like. The diluting gas may be an inert gas other than nitrogen, for example, helium (He), neon (Ne), argon (Ar), krypton (Kr), or xenon (Xe).

In the aforementioned embodiments, the present disclosure has been described by way of an example of using the batch-type process apparatus having a double tube structure as the process apparatus 1. As an alternative example, the present disclosure may also be applied to a batch-type process apparatus having a single tube structure. Moreover, the present disclosure may be applied to a batch-type horizontal process apparatus or a single-substrate type process apparatus.

The controller 100 employed in the embodiments of the present disclosure may be realized using a typical computer system instead of a dedicated computer system. For example, the controller 100 for performing the aforementioned processes may be configured by installing programs for executing processes into a general-purpose computer through a recording medium (a floppy disk, a compact disc-read only memory (CD-ROM), or the like) which stores programs for performing the aforementioned processes.

The programs may be provided by arbitrary means. The programs may be provided not only by the recording medium mentioned above but also through a communication line, a communication network, a communication system or the like. In the latter case, the programs may be posted on bulletin boards (BBSs: Bulletin Board Systems) and provided through a network. The program thus provided is executed in the same manner as other application programs under the control of an operating system (OS), thereby performing the processes described above.

The present disclosure is applicable to any method and apparatus for forming a thin film.

According to the present disclosure in some embodiments, it is possible to form a thin film without reduction in film thickness or deterioration in thickness uniformity.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of forming a thin film, comprising:
performing a first film formation process of, while an interior of a reaction chamber accommodating an object to be processed is heated to a predetermined temperature, alternately supplying a plurality of times: an organic metal compound gas into the reaction chamber to adsorb the organic metal compound onto the object to be processed, and H2O as the only oxidizing agent into the reaction chamber heated to the predetermined temperature to oxidize the organic metal compound adsorbed onto the object to be processed, thereby forming a thin film;
after the first film formation process is ended, performing once an annealing process of, while the interior of the reaction chamber is heated to the predetermined temperature, supplying ozone having stronger oxidizing power than H2O into the reaction chamber; and
after the annealing process is ended, performing a second film formation process of, while the interior of the reaction chamber is heated to the predetermined temperature, alternately supplying a plurality of times: the organic metal compound gas into the reaction chamber to adsorb the organic metal compound onto the thin film formed in the first film formation process, and ozone as the only oxidizing agent into the reaction chamber heated to the predetermined temperature to oxidize the organic metal compound adsorbed onto the thin film formed in the first film formation process, thereby forming a thin film.

2. The method of claim 1, wherein the predetermined temperature ranges from 200 degrees C. to 300 degrees C.

* * * * *